US012648213B2

(12) United States Patent　　　　　　(10) Patent No.:　US 12,648,213 B2
Subramanian　　　　　　　　　　　　(45) Date of Patent:　Jun. 2, 2026

(54) METHODS FOR FORMING STACKED TRANSISTOR DEVICES INCLUDING A NANOSHEET FIELD-EFFECT TRANSISTOR AND A FIN FIELD-EFFECT TRANSISTOR

(71) Applicant: IMEC VZW, Leuven (BE)

(72) Inventor: Sujith Subramanian, Leuven (BE)

(73) Assignee: IMEC VZW, Leuven (BE)

( * ) Notice: Subject to any disclaimer, the term of this patent is extended or adjusted under 35 U.S.C. 154(b) by 317 days.

(21) Appl. No.: 18/343,467

(22) Filed: Jun. 28, 2023

(65) Prior Publication Data

US 2024/0128124 A1　　Apr. 18, 2024

(30) Foreign Application Priority Data

Jun. 30, 2022　(EP) ..................................... 22182247

(51) Int. Cl.
　　*H10D 84/01*　　　(2026.01)
　　*H10D 84/03*　　　(2025.01)
　　　　　(Continued)
(52) U.S. Cl.
　　CPC ....... *H10D 84/0193* (2025.01); *H10D 84/038* (2025.01); *H10D 86/00* (2025.01); *H10D 88/01* (2025.01)
(58) Field of Classification Search
　　CPC ....... H10D 30/01; H10D 30/019–0198; H10D 30/024; H10D 30/501–509; H10D 30/62; H10D 30/6735; H10D 30/674; H10D 30/6757; H10D 62/121; H10D 62/151; H10D 64/017; H10D 84/01; H10D 84/0128; H10D 84/0135; H10D 84/0158;
　　　　　(Continued)

(56) References Cited

U.S. PATENT DOCUMENTS

2020/0119015 A1　4/2020　Bi et al.
2020/0235092 A1　7/2020　Lilak et al.
　　　　(Continued)

FOREIGN PATENT DOCUMENTS

EP　　　3588546 A1　1/2020
EP　　　3675158 A2　7/2020

OTHER PUBLICATIONS

European Search Report for Application No. EP 22182247, dated Feb. 9, 2023, in 18 pages.

(Continued)

*Primary Examiner* — Cheung Lee
(74) *Attorney, Agent, or Firm* — Knobbe, Martens, Olson & Bear, LLP

(57)　　　　　ABSTRACT

A method for forming a stacked transistor device is disclosed, in which a nanosheet field-effect transistor (FET) structure and a fin FET structure are formed. The method comprises forming a first fin structure and a second fin structure from a vertical stack, wherein the second fin structure is arranged above the first fin structure, and wherein the vertical stack comprises a middle layer arranged between the first and second fin structures. The method further comprises forming, from above, a gate structure across a channel region of the second fin structure, forming, from below, a gate structure across a channel region of the first fin structure, and forming source and drain regions for the first and second fin structures.

15 Claims, 11 Drawing Sheets

(51) Int. Cl.
 *H10D 86/00* (2025.01)
 *H10D 88/00* (2025.01)

(58) Field of Classification Search
 CPC ........... H10D 84/0167; H10D 84/0172; H10D 84/0177; H10D 84/0193; H10D 84/038; H10D 84/8311; H10D 84/8312; H10D 84/83135; H10D 84/83138; H10D 84/8314; H10D 84/8316; H10D 84/835; H10D 84/836; H10D 84/837–839; H10D 84/851–852; H10D 84/853; H10D 84/856; H10D 86/00; H10D 88/01; H10D 84/0137
 See application file for complete search history.

(56) References Cited

U.S. PATENT DOCUMENTS

| | | | |
|---|---|---|---|
| 2021/0202497 A1 | 7/2021 | Lin et al. | |
| 2021/0320035 A1 | 10/2021 | Xie et al. | |
| 2021/0351078 A1 | 11/2021 | Lilak et al. | |
| 2022/0122892 A1 | 4/2022 | Smith | |
| 2022/0165730 A1 | 5/2022 | Chen et al. | |
| 2023/0178553 A1* | 6/2023 | Xie | H10D 62/121 |
| | | | 257/351 |

OTHER PUBLICATIONS

Jung Seung-Geun et al., "Analytical Model of Contact Resistance in Vertically Stacked Nanosheet FETs for Sub-3-nm Technology Node", IEEE, vol. 69, No. 3, Mar. 2022, pp. 930-935.
Wang, et al. "Challenges and Opportunities for Stacked Transistor: DTCO and Device", Symposium on VLSI Technology Digest of Technical Papers, 2021 in two pgs.

* cited by examiner

A - A'

METHODS FOR FORMING STACKED TRANSISTOR DEVICES INCLUDING A NANOSHEET FIELD-EFFECT TRANSISTOR AND A FIN FIELD-EFFECT TRANSISTOR

CROSS-REFERENCE TO RELATED APPLICATIONS

This application claims foreign priority to European Patent Application No. 22182247.1, filed Jun. 30, 2022, the content of which is incorporated by reference herein in its entirety.

BACKGROUND

Field

The present disclosure relates generally to a method of forming a transistor device and more particularly to forming a stacked transistor device comprising a nanosheet field-effect transistor structure and a fin field-effect transistor structure on a semiconductor substrate.

Description of the Related Technology

Modern semiconductor integrated circuit technology includes horizontal channel transistors, for example the fin field-effect transistor (FinFET) and the horizontal or lateral nanosheet field-effect transistor (NSHFET). Such devices typically include a source, a drain, a channel comprising a fin-shaped channel layer (in the case of a FinFET) or one or more horizontally extending channel nanosheets (in the case of a NSHFET), and a gate stack surrounding the channel.

To facilitate more area efficient circuitry, stacked transistor device structures have been developed. An example of a stacked transistor device is the complementary field-effect transistor (CFET) device. The CFET device comprises a complementary pair of FETs, such as a complementary pair of NSHFETs stacked on top of each other (e.g., a p-channel field-effect transistor (pFET) bottom device and an n-channel field-effect transistor (nFET) top device, or vice versa). The CFET device allows for a reduced footprint compared to a traditional side-by-side arrangement of a pFET and nFET.

Using what may be referred to as a "sequential" process, a CFET device comprising NSHFET bottom and top devices may be formed by processing the bottom device first. The stack of channel nanosheets for the top devices is then bonded on top of the bottom device using a wafer bonding process. After processing source and drain regions on the upper channel nanosheets (e.g., comprising source and drain epitaxy), the upper channel nanosheets may be provided with a gate stack which is electrically connected to the gate stack of the bottom device.

SUMMARY OF CERTAIN INVENTIVE ASPECTS

While methods for forming stacked transistor devices, such as the CFET device, have been developed, existing processes are typically designed to form device structures comprising bottom and top devices of a same channel geometry, such as NSHFET bottom and top devices. However, as realized by the inventors, different channel geometries for the bottom and top devices may in some instances provide improved device performance.

In light of the above, it is an objective of the present inventive concept to provide a method enabling forming of a stacked transistor device comprising a nanosheet field-effect transistor structure and a fin field-effect transistor structure.

According to an aspect there is provided a method for forming a stacked transistor device comprising a nanosheet field-effect transistor (NSHFET) structure and a fin field-effect transistor (FinFET) structure on a substrate, comprising: forming a vertical stack comprising a first channel structure arranged on the substrate, a middle layer arranged on the first channel structure, and a second channel structure arranged on a sacrificial middle layer; forming a first fin structure of the first channel structure and a second fin structure of the second channel structure; forming, from above, a gate structure across a channel region of the second channel structure; forming, from below, a gate structure across a channel region of the first channel structure; and forming source and drain regions for the first and second channel structures; wherein a first one of the first and second channel structures comprises a stack of channel nanosheets, thereby forming the NSHFET structure, and wherein the other one of the first and second channel structures comprises a channel fin, thereby forming the FinFET structure.

By the method, a stacked transistor device comprising a FinFET structure and a NSHFET structure is formed.

Both fin structures (e.g., the first fin structure and the second fin structure) may be formed from the vertical stack of channel structures in a common patterning process, which can result in the FinFET structure and the NSHFET structure being vertically aligned with respect to each other. This is advantageous over, for example, sequentially formed CFET devices, in which the top device is provided on top of the bottom device by means of a wafer bonding process and the alignment between the two FETs thereby is limited by the alignment precision of the bonding process. With the present inventive method, the channel region of the top FET structure may be self-aligned with the bottom device.

The presence of the middle insulating layer in the stack comprising the first channel structure and the second channel structure can provide electrical separation between the channel nanosheets and the channel fin of the resulting NSHFET and FinFET structures. Additionally, the middle insulating layer can provide a separation between the first and second channel structures during the processing, thereby providing a vertical margin facilitating individual processing of the channel structures, such as while forming the gate structures and/or the source/drain regions. This may be better understood from various embodiments of the method set out in more detail below.

Since the method comprises processing of the first and second fin structures from a common stack of channel structures, the method lends itself to forming what may be referred to as a "monolithic" stacked transistor device. However, compared to other "monolithic" processes, the present method involves processing of source/drain regions and gate structures from opposite sides of the stack, wherein the second channel structure can be processed from above and the first channel structure can be processed from below, similar to what may be referred to as a "sequential" processing. The present method may therefore be referred to as a "hybrid" processing, utilizing the advantages of both monolithic processing and sequential processing.

Although the method may advantageously be used to form CFET devices, it is contemplated that the method may be used also to form other non-CFET-type stacked transistor devices, which may benefit from including a combination of a NSHFET structure and a FinFET structure.

Terms and Definitions

The term "fin structure" as used herein can refer to an elongated semiconductor feature comprising a single layer or a layer stack with a longitudinal dimension oriented along the substrate and protruding vertically therefrom.

The term "layer stack" can refer to a structure of layers sequentially formed on top of each other.

The terms "first channel structure" and "second channel structure" can be understood as referring to the layer(s) or sub-stacks of a layer stack arranged on a substrate, from which first and second fin structures can be formed. The vertical stack from which the stacked transistor device is formed may comprise a first channel structure, a second channel structure, and a middle layer arranged therebetween.

Relative spatial terms such as "vertical," "upper," "lower," "top," "bottom," "stacked on top of," and so forth are herein to be understood as denoting locations or directions within a frame of reference of the stacked transistor device. In particular, the terms may be understood in relation to a direction crossing a main surface of a substrate, including a direction normal to the substrate, or equivalently in relation to a bottom-up direction of the device layer stack. Correspondingly, terms such as "lateral" and "horizontal" are to be understood as locations or directions parallel to the substrate, for example parallel to an upper surface or a main plane of extension of the substrate.

The first and second fin structures may be formed by patterning the vertical stack using, for example, a hard mask as an etch mask. The fin structures may be precisely and efficiently formed in a common patterning process.

In some embodiments, the stack of nanosheets can include a number of sacrificial nanosheets interleaved among the nanosheets, and the method may further comprise, subsequent to forming the source and drain regions, selectively removing sacrificial nanosheet portions from the channel region and thereafter forming the gate structure. In some embodiments, the channel nanosheets may be "released," such that the gate structure subsequently may be formed at least partially in spaces between the channel nanosheets. The gate structure may form a wrap-around gate with respect to the channel nanosheets.

In some embodiments, the method may comprise, prior to selectively removing the sacrificial nanosheet portions, forming at least one anchoring structure extending across the stack of nanosheets, whereby the nanosheets are anchored by the anchoring structure while the sacrificial nanosheet portions are being removed. The anchoring structure may be formed by depositing an anchoring material layer structure of one or more layers on the stack of nanosheets and patterning the anchoring material layer structure to form the anchoring structure. The anchoring material layer structure may be formed in contact (e.g., in abutment) with each nanosheet to provide support during the removal of the sacrificial nanosheets of the stack.

In some embodiments, a sacrificial gate structure may be formed across the nanosheet portions after the release of the channel nanosheets. After the forming of the source and drain regions, the sacrificial gate structure may be replaced with the final gate structure. The gate structure may hence be formed in accordance with a replacement metal gate (RMG) process. The sacrificial gate structure can enable each of the source/drain regions and the final functional gate structure to be self-aligned with respect to the channel region.

In some embodiments, the middle layer may be a sacrificial middle layer which can be replaced by a dielectric insulating layer separating the first and second fin structures. The initial, sacrificial middle layer may be formed at the same time as the first and second channel structures, for instance using epitaxial growth of Si and/or SiGe at a composition allowing selective etching of the sacrificial middle layer with respect to the first and/or second channel structures. The sacrificial middle layer may be replaced with an isolating oxide, such as $SiO_2$.

In some embodiments, a width of the channel fin may be reduced in a "trimming" process, in which the lateral sidewalls of the channel fins may be etched to provide a thinner channel fin. The trimming may be performed after the sacrificial middle layer has been replaced with a dielectric insulating layer. In some embodiments, the channel fin height may be reduced in an etching or chemical-mechanical polished (CMP) process. The trimming of the channel fin may be performed to alter the electrical performance of the resulting FinFET, for example to match the performance of the FinFET with the performance of the NSHFET.

In some embodiments, the method may further comprise turning the substrate upside down to allow processing from the backside of the substrate. For example, flipping the substrate can enable the gate structure at the channel region of the first fin structure to be processed from below. The method may comprise forming a bonding layer above the second fin structure and bonding a carrier wafer to the bonding layer. The carrier wafer may be used for flipping, or turning, the substrate upside down. The flipping may, for example, be performed after the forming of the source/drain regions and the gate structures of the second fin structure.

It will be appreciated that, in the context of the present disclosure, the substrate may be described in terms of its frontside and backside, where the second transistor structure may be at least partly processed from the frontside and the first transistor structure may be at least partly processed from the backside. Processing "from the backside" may also be referred to as "from below", regardless of whether the substrate has been flipped or not.

In some embodiments, the first fin structure can include the channel fin and the second fin structure can include the stack of channel nanosheets. In some embodiments, the method may further comprise: forming a process layer embedding the first fin structure and the second fin structure; etching the first fin structure from below to form a recess in the process layer; forming spacers on opposite side surfaces of the recess to form a reduced-width gap between the spacers; splitting the first fin structure by etching back the first fin structure in the reduced-width gap, using the spacers as an etch mask protecting the underlying portions of the first fin structure; and removing the process layer and the spacers to reveal the remaining portions of the first fin structure, forming a first and a second channel fin.

By this method, a two-FinFET structure may be provided. Beneficially, increasing the number of fins from one to two may be an alternative to increasing the fin height to achieve desired electrical performance of the FinFET.

By embedding the fin structure in the process layer and subsequently recessing the fin structure into the process layer, the gap formed in the process layer may be self-aligned with respect to the fin structure. The subsequent forming of the spacer layers on the opposite side surfaces of the gap in the process layer, can enable the width of the gap (which can be, for example, a self-aligned gap) to be trimmed (e.g., as seen along a direction across the fin structure) such that the fin structure may be split into two channel fins by etching-back of the exposed central portion of the upper surface of the fin structure. The self-alignment may accordingly be conferred to the channel fins with respect to the underlying channel nanosheets. Spacer layers may be formed with precise and uniform thickness, for example using a conformal sidewall spacer deposition process, wherein the two channel fins may be formed with a substantially uniform width.

In some embodiments, the first fin structure may comprise an etch-stop layer, which can facilitate etching of the first fin to form the recess to stop when the etch stop layer is exposed. The etch stop layer may be a separate layer arranged in the channel stack from which the first fin structure is formed. Alternatively, the etch stop functionality may be provided by the middle layer on which the first fin structure is arranged.

In some embodiments, forming the source and drain regions can include forming epitaxial source and drain bodies of a first conductivity type on opposite end surfaces of the channel nanosheets and forming epitaxial source and drain bodies of a second conductivity type on opposite end surfaces of the channel fin. In some embodiments, an NSFHET and a FinFET of complementary conductivity types can be formed.

In some embodiments, the channel nanosheets can be formed of $SiGe_y$, and the channel fin can be formed of $SiGe_z$, wherein each one of y and z is greater than or equal to 0 and wherein y differs from z. In some embodiments, Si- and/or SiGe-based stacked transistor structure may be formed.

In some embodiments, the lower channel nanosheets may be formed of Si (e.g., y=0) and the upper channel layer may formed be of $SiGe_z$ (for example, $z \geq 0.15$). In some embodiments, the method may comprise forming epitaxial source and drain bodies of an n-type on opposite end surfaces of channel nanosheet portions of the channel region and epitaxial source and drain bodies of a p-type on opposite end surfaces of channel fin portions of the channel region.

In some embodiments, the sacrificial nanosheets can be formed of $SiGe_x$, wherein x is greater than or equal to 0 and y differs from x and z.

The different Ge-content of the sacrificial nanosheets and lower channel nanosheets (e.g., x≠y) can facilitate the selective removal of the sacrificial nanosheet portions from the channel region.

In some embodiments, wherein the initial middle layer is a sacrificial middle layer arranged between the first and second fin structures, the sacrificial middle layer may be made of SiGe, with a Ge composition differing from at least one of the channel fin, the channel nanosheets, and the sacrificial nanosheets to allow selective removal of the sacrificial middle layer. In some examples, the sacrificial middle layer may be of a Ge composition similar to the composition of the sacrificial nanosheets to allow the sacrificial middle layer and the sacrificial nanosheets to be removed in a same etching process.

BRIEF DESCRIPTION OF THE DRAWINGS

The above, as well as additional objects, features, and advantages, may be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Methods for forming a stacked transistor device, such as a CFET device comprising a NSHFET structure and a FinFET structure, according to a number of embodiments will in the following be described with reference to the figures.

Figure 1A:
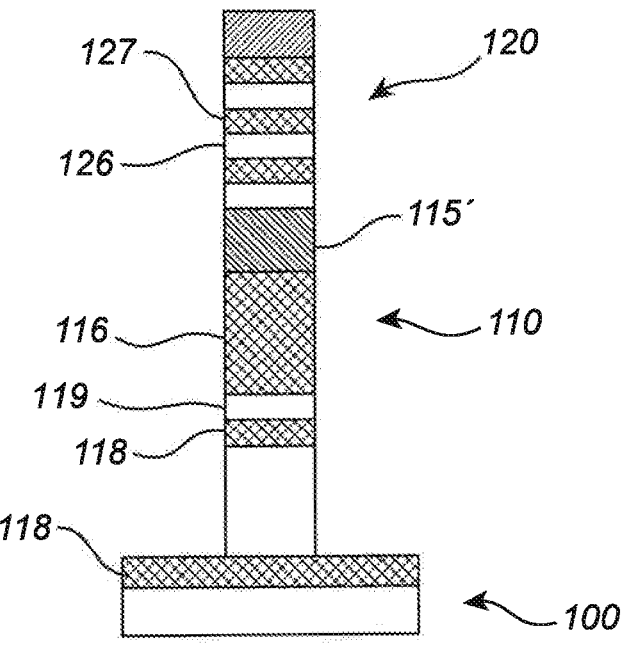
FIGS. 1a-1i illustrate intermediate structures at various stages of a method for forming a channel fin arranged above a number of channel nanosheets according to some embodiments.

In FIG. 1a, a fin structure has been formed on a substrate 100. The substrate 100 may be a conventional semiconductor substrate suitable for CMOS processing. The substrate 100 may be a single-layered semiconductor substrate, for instance formed by a bulk substrate such as a silicon (Si) substrate, a germanium (Ge) substrate or a silicon-germanium (SiGe) substrate. A multi-layered/composite substrate is also possible, such as an epitaxially grown semiconductor layer on a bulk substrate, or a semiconductor-on-insulator (SOI) substrate, such as a Si-on-insulator substrate, a Ge-on-insulator substrate, or a SiGe-on-insulator substrate.

The fin structure can be formed by an elongated fin-shape layer stack with a longitudinal dimension oriented in a first horizontal direction along the substrate 100 and protruding in a vertical direction from the substrate 100. A width dimension of the fin structure can be oriented in a second horizontal direction transverse to the first horizontal directions.

The fin structure can include, in a bottom-up direction, a lower fin structure 110, also referred to as a first fin structure 110, a sacrificial middle layer 115' arranged on the first channel structure, which may be replaced by a final, dielectric separating layer 115 as will be discussed below, and an upper fin structure 120 arranged above the sacrificial middle layer 115'. The upper fin structure 120 may also be referred to as a second fin structure 120. Etch stop layers 118 and isolating layers 119 may be provided between the first fin structure 110 and the substrate 100 to facilitate subsequent processing.

In FIG. 1a, the first fin structure 110 comprises a channel fin layer 116, from which the FinFET structure can be formed, and the second fin structure 120 comprises a stack of channel nanosheets 126 from which the NSHFET structure can be formed. The stack of channel nanosheets 126 is arranged alternatingly with sacrificial nanosheets 127, as seen along the vertical direction. The second fin structure 120 is, as seen, arranged over the first fin structure 110 with the sacrificial middle layer 115' intermediate the first fin structure 110 and the second fin structure 120. Other configurations are however also possible, as will be discussed below in connections with FIGS. 2a-2d.

The sacrificial nanosheets 127 of the second, upper fin structure 120 can be formed of a material ("sacrificial material") such as a semiconductor material that is different from a semiconductor material of the channel nanosheets 126 ("nanosheet channel material") and can be selected to be removable selectively to the channel material. As used herein, the term "selective" in connection with removal of a material or feature (e.g., a layer or layer portion) means that the material or feature can be removed/removable using an etching process etching the material/feature at a rate greater than another material/feature exposed to the etching process. The fin 116 of the lower, first fin structure 110 may be formed of a semiconductor material ("fin channel material") different from the nanosheet channel material. It is however envisioned that the nanosheet channel material and the fin channel material may be a same material or different materials.

The sacrificial nanosheet material may be $SiGe_x$. The nanosheet channel material may be $SiGe_y$. The fin channel material may be $SiGe_z$. Each one of x, y, z can be greater than or equal to zero 0, y may not be equal to x, and/or y may not be equal to z. For example, $x \geq y+d$ and $z \geq y+d$ where d=0.15. A 0.15 difference in Ge-content of the sacrificial material and the nanosheet channel material may facilitate a selective removal of the sacrificial material with respect to the nanosheet channel material. For example, the Ge-content of the nanosheet channel material may be 0 (e.g., Si, y=0), the Ge-content of the sacrificial nanosheet material may be in a range from about 0.15 to about 0.45 (e.g., x=0.15 to 0.45), and the Ge-content of the fin channel material may be in a range from about 0.15 to about 0.65 (e.g., z=0.15 to 0.65), such as about 0.15 to about 0.45 (e.g., z=0.15 to 0.45). For example, a SiGe material with a greater Ge content than another Si or SiGe material may be etched selectively (e.g., at a greater rate) using an HCl-based dry etch. A further example is an etching chemistry including an ammonia peroxide mixture (APM). However, other appropriate etching processes (wet or dry) allowing selective etching of higher Ge-content SiGe material with respect to lower Ge-content SiGe (or Si) materials are per se known in the art and may also be employed for this purpose.

A nanosheet channel material of Si and a fin channel material of SiGe can lend itself for a CFET device comprising a NSHFET of an n-type and a FinFET of a p-type. More generally, the Ge-content of the nanosheet and fin channel materials may be selected to optimize the channel properties for the NSHFET and FinFET devices. While Si as nanosheet channel material and SiGe as fin channel material may facilitate forming of a NSHFET structure and FinFET structure of n-type and p-type respectively, it is envisaged that the method also may be applied to a fin structure comprising SiGe as a nanosheet channel material, Si as a sacrificial nanosheet material, and Si as a fin channel material.

The channel nanosheets 126 and the sacrificial nanosheets 127 may each be formed with a width (in the horizontal plane) to thickness (along the vertical direction) ratio greater than 1, such as a width in a range from 10 nm to 30 nm and a thickness in a range from 3 nm to 10 nm. The channel fin 116 may be formed with a thickness greater than a thickness of each channel nanosheet 126, such as at least twice the thickness of a channel nanosheet 116. For example, the channel fin 116 may be formed with a thickness in a range from about 20 nm to about 50 nm (e.g., 20 nm to 50 nm).

While FIG. 1*a* illustrates the second fin structure 120 comprising three channel nanosheets 126, the number of channel nanosheets 126 may differ from the depicted example. For example, the second fin structure 120 may comprise a greater number of channel nanosheets 126, such as four or five, or more, arranged alternatingly with sacrificial nanosheets 127. In particular, each channel nanosheet 126 may be arranged between a pair of sacrificial layers 127.

The sacrificial nanosheets 127, the channel nanosheets 126, and the channel fin 116 may each be formed as epitaxial layers, e.g., layers formed using an epitaxial growth or deposition process.

The initial middle layer 115' may be a sacrificial layer formed of Si or Ge, or compositions thereof, having a Ge (or Si) content that allows it to be selectively removed with respect to the nanosheet channel material or the fin channel material, or both. The removed sacrificial layer may be replaced with an insulating layer, which can comprise an insulating material such as an oxide or a nitride. For example, the middle insulating layer 115 may be formed of $SiO_2$, SiN, or SiCN. The middle insulating layer 115 may, for example, be formed with a thickness in a range from about 20 to about 50 nm (e.g., 20 nm to 50 nm).

Although referred to and illustrated as a single layer, the middle layer 115 may also be formed as a composite layer structure comprising, for example, a stack of two or more different insulating layers.

The first and second fin structures 110, 120 may be formed from an initial vertical stack, which may be epitaxially grown on the substrate 100 and patterned into the fin structures 110, 120. The patterning of the initial stack may comprise depositing and patterning a hard mask layer to form a hard mask (not shown). Conventional patterning techniques such as lithography and etching ("litho-etch") or multiple-patterning techniques such as (litho-etch)$^x$, and/or self-aligned double or quadruple patterning (SADP or SAQP), can be used to pattern the hard mask layer. The pattern defined by the hard mask may be transferred into the initial stack by etching, using the hard mask as an etch mask.

Figure 1B:
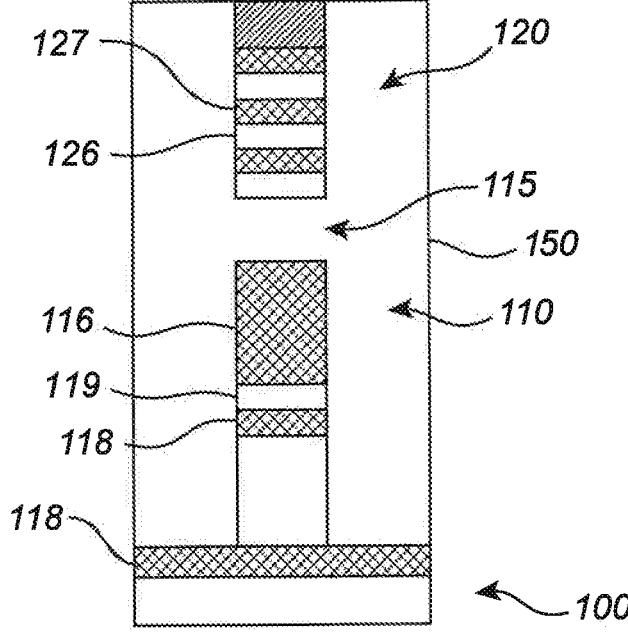

In FIG. 1*b*, the sacrificial middle layer 115' between the first and second fin structures 110, 120 has been replaced with a dielectric insulating material, such as an oxide or nitride such as $SiO_2$ or SiN, by selectively removing the intermediate sacrificial layer 115' and filling the resulting elongated cavity with the insulating material to form the middle insulating layer 115 and, as shown in the example in FIG. 1*b*, a process layer 150 embedding the first and second fin structures 110, 120.

Figures 1C, 1D:
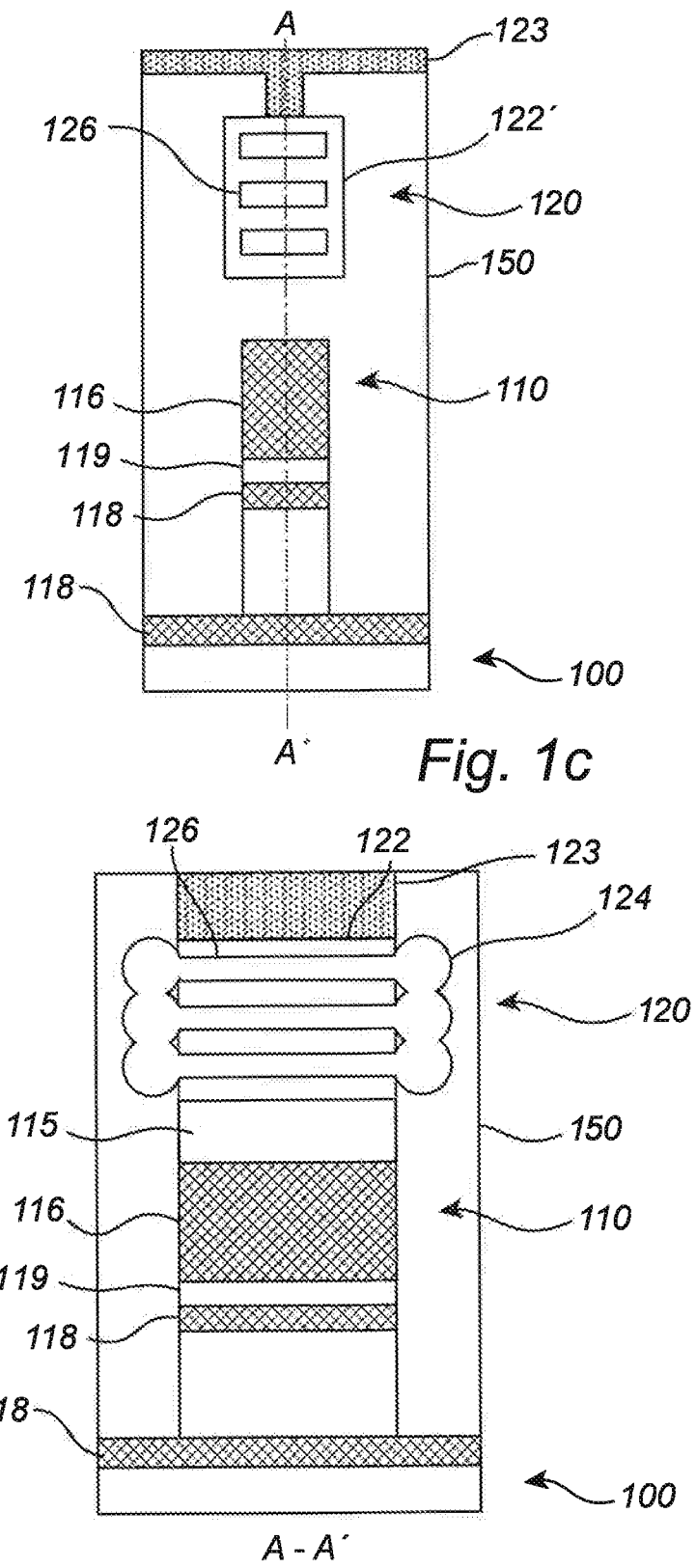

FIG. 1*c* shows the second fin structure 120 after the formation of a second gate structure 122' at channel portions of the channel nanosheets 126. The second gate structure 122' may be a sacrificial gate structure 122' involved in a replacement metal gate (RMG) process, or a final gate structure 122. Further, a gate contact 123 has been formed, allowing the gate structure 122 to be contacted (e.g., electrically contacted) from above.

Prior to forming the sacrificial gate structure 122', portions of the sacrificial nanosheets 127 can be removed from the channel region, thereby defining released or suspended channel nanosheet portions 126 in the channel region. An etching process selective to the sacrificial material of the sacrificial nanosheets 127 may be used. For example, SiGe sacrificial material may be removed selectively to Si nanosheet channel material (or SiGe channel material with a lower Ge-content than the SiGe sacrificial material) using HCl or APM. A temporary support structure, comprising one or more elongated support structures (e.g., one or more lines of amorphous Si or the insulating material forming the middle layer 116) extending across the second fin structures 120 may be used for supporting the channel nanosheets 126 during the removal of the sacrificial nanosheets 127. The temporary support structure may also be referred to as an anchoring structure, and the removal of the sacrificial nanosheets 127 may be referred to as a "fin release" process.

By releasing portions of the nanosheets, the gate structure 122 may be wrapped around the channel nanosheets 126. If an RMG process is employed, the sacrificial gate structure 122' can be replaced with the final gate structure 122 at a later stage in the processing, such as after the formation of source/drain regions. The final gate structure 122 may comprise a gate dielectric layer, one or more effective work function metal (WFM) layers, and a gate fill metal. The gate dielectric layer may be formed of a conventional a high-k dielectric such as $HfO_2$, HfSiO, LaO, AlO, or ZrO. The WFM layer may be formed of one or more effective WFMs (e.g., an n-type WFM such as TiAl or TiAlC and/or a p-type WFM such as TiN or TaN). The gate fill metal may be formed of conventional gate fill metals such as W, Al, Co, or Ru. The gate dielectric layer and the first WFM may be deposited by ALD. The gate fill metal may for example be deposited by CVD or physical vapor deposition (PVD). The gate stack may, after deposition, be recessed using a metal etch-back process to provide the functional gate structure with a desired vertical dimension.

Prior to forming the final gate structure 122, and subsequent to forming the sacrificial gate structure 122' in the RMG process, the source/drain regions 124 may be formed by epitaxially growing semiconductor source/drain bodies on end surfaces of the portions of the channel nanosheets 124 exposed at either sides of the channel region and the sacrificial gate structure 122'. The source/drain bodies 124 formed on the channel nanosheets 126 may be doped in situ. The resulting structure is shown in FIG. 1*d*, which illustrates a cross section along line A-A' in FIG. 1*c*.

Figure 1E:
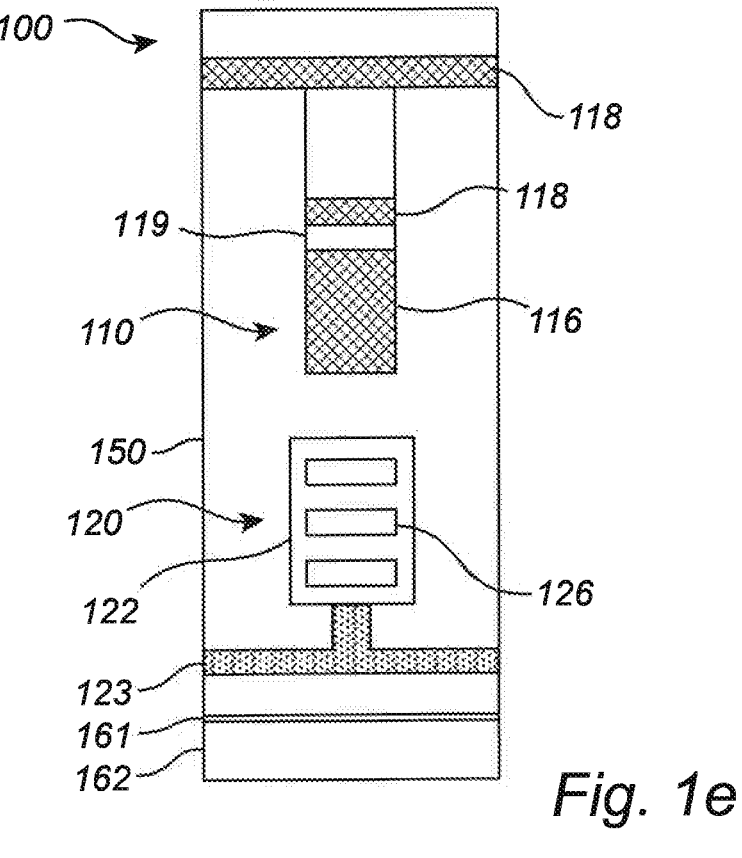
Figure 1F:
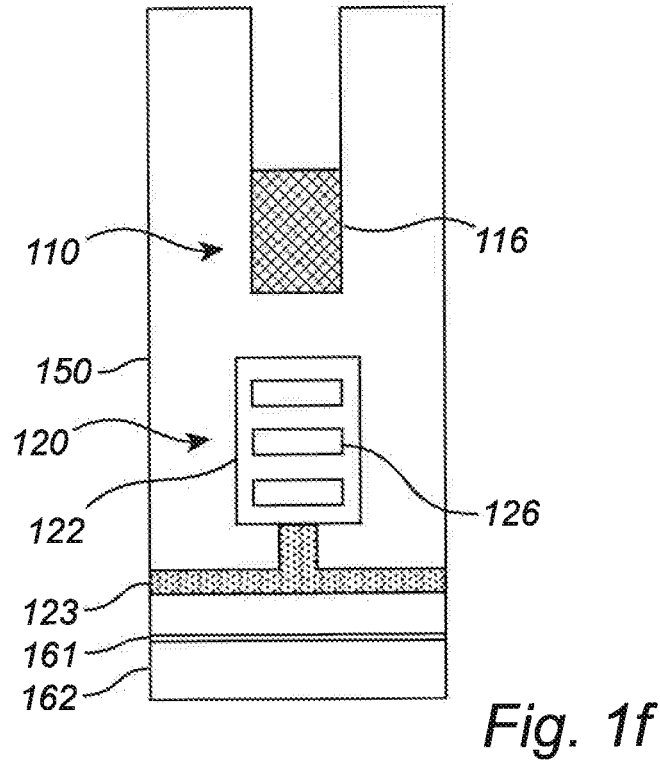

To allow processing of the first fin structure 110 from below, a carrier wafer 162 may be bonded to a bonding layer 161 formed above the second fin structure 120 the substrate 100, and the substrate can be flipped upside down, as shown in FIG. 1*e*.

Figure 1G:
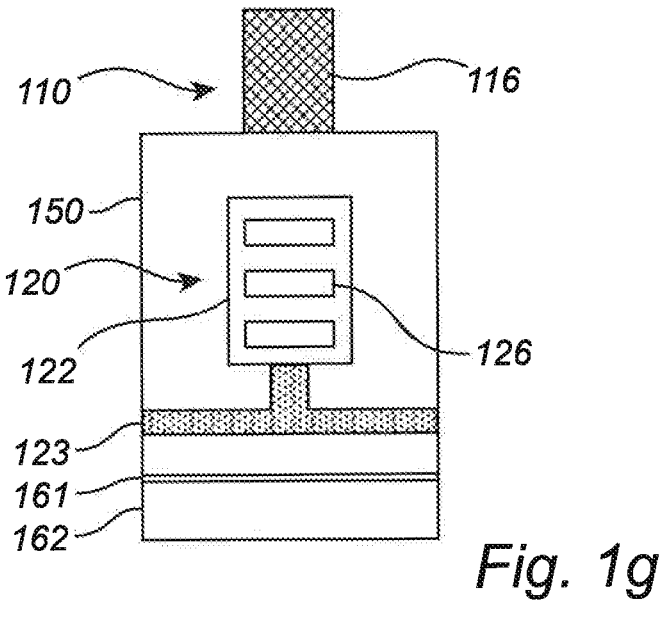

In Figure if, the substrate 100 has been removed, for instance by means of planarizing and recessing the substrate 100 in a chemical-mechanical polishing (CMP) process, and the channel fin 116 has been etched back into the process layer 150. The etching may be performed in several steps, using one or several etch stop layers 118 to achieve more precise process control and reduce the risk of over etch. Thereafter, the process layer 150 may be etched back to reveal the channel fin 116 which, as shown in FIG. 1*g*, may protrude vertically from a surface of the process layer 150.

Figure 1H:
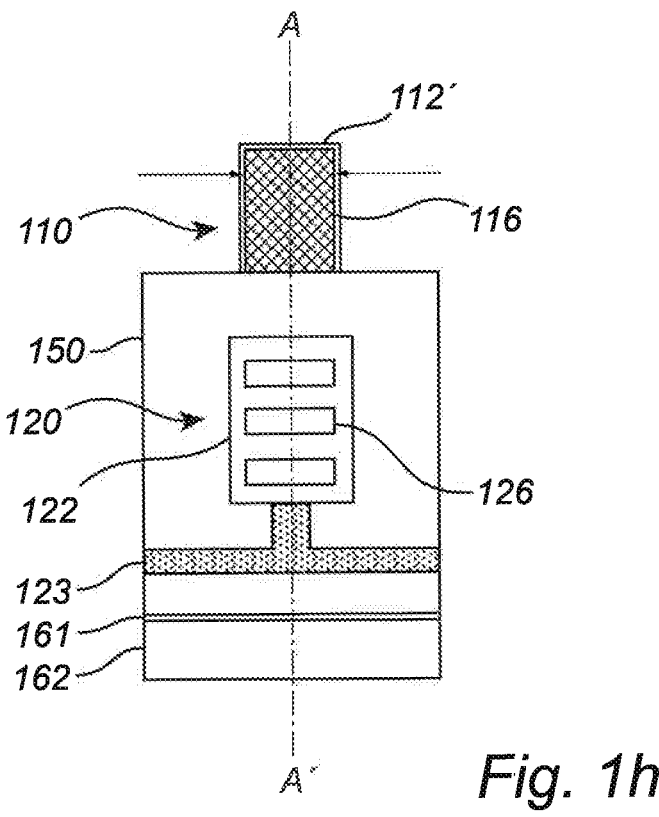

The channel fin 116 may be trimmed (e.g., as seen along a direction across the channel fin 116) such that the width of the fin is reduced compared to the width of the channel nanosheets 126, as shown in FIG. 1*h*. This may be achieved by etching the channel fin 116 using an anisotropic etching process etching the side surfaces of the channel 116.

A sacrificial gate structure 112' may be formed on the channel region of the channel fin 116, allowing source/drain regions 114 to be formed by, for example, epitaxially growing semiconductor source/drain bodies on end surfaces of the portions of the channel fin 116 exposed at either sides of the channel region and the sacrificial gate structure 112'.

Figure 1I:
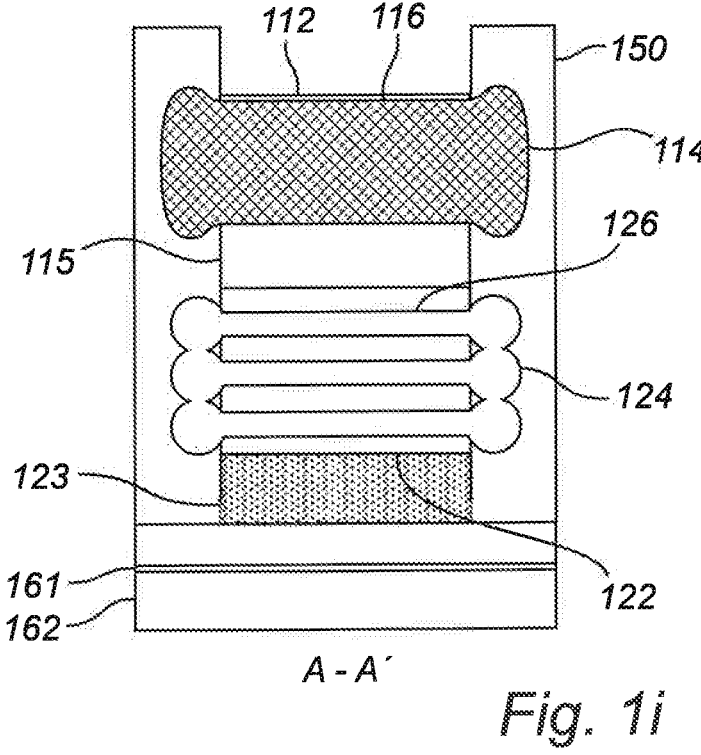

FIG. 1*i* is a cross section along line A-A' in FIG. 1*h*, illustrating the source/drain regions 114, 124 of the channel regions of the channel fin 116 and the channel nanosheets 126 as mentioned above. Further, the sacrificial gate structures 112', 122' have been replaced with the final gate structures 112, 122.

An alternative configuration will now be discussed with reference to FIGS. 2*a*-2*d*. The first fin structure 110, the second fin structure 120, and the intermediate middle layer 115, as well as the processing thereof, may be similar to what is described above. However, in this alternative configuration the stacking order of the channel fin 116 and the channel nanosheets 126 is reversed. Hence, the first fin structure 110, arranged closest to the substrate 100, comprises the stack of channel nanosheets 126 whereas the second fin structure 120, arranged above the first fin structure 110 and the sacrificial intermediate layer 115' (as seen from the substrate), comprises the channel fin 116.

Figure 2A:
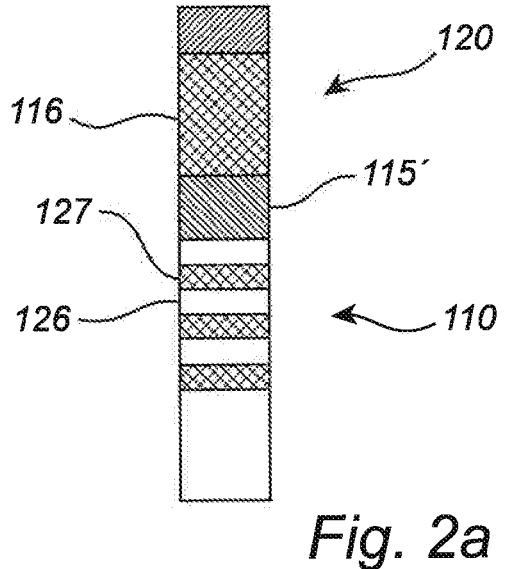
FIGS. 2a-2d illustrate intermediate structures at various stages of a method for forming a number of channel nanosheets arranged above a channel fin according to some embodiments.
Figure 2B:
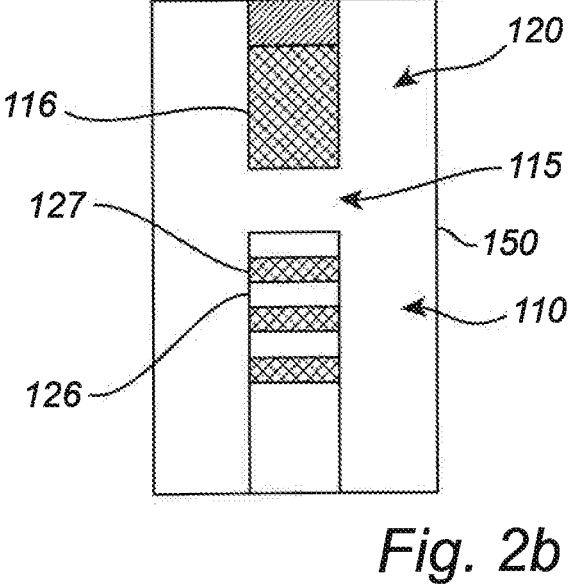
Figure 2C:
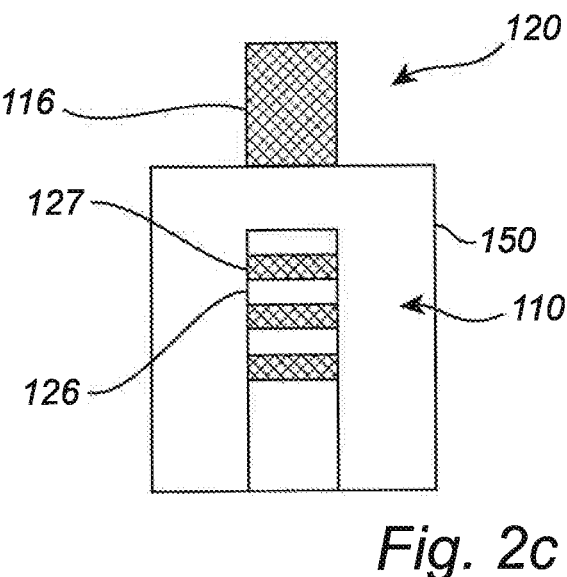
Figure 2D:
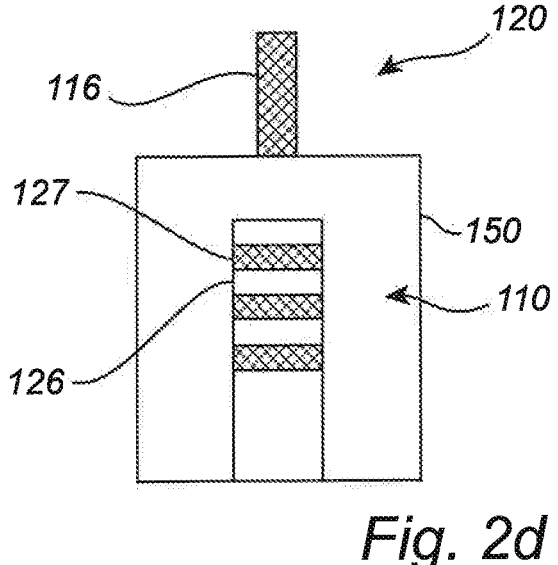

In FIG. 2*b*, the sacrificial middle layer 115' has been replaced with an isolating material layer 115 and the fin structures 116, 126 embedded in a process layer 150, similar to what is described above with reference to FIG. 1*b*. The second fin structure 120 may be processed from above in an etch process, in which the process layer 150 is etched back to reveal the channel fin 116. The result is illustrated in FIG. 2*c*, showing the channel fin 116 protruding from a surface of the process layer 150. Thereafter, the channel fin 116 may be subject to a trimming or thinning process similar to the one discussed in connection with FIG. 1*h*, resulting in the reduced width shown in FIG. 2*d*.

In subsequent processing steps, a carrier wafer may be bonded above the first fin structure 110 and the substrate can be turned upside down to facilitate processing of the second fin structure 120 from below. In this processing, the channel nanosheets 126 may be released, a sacrificial gate structure maybe formed, and the source/drain regions may be grown in a similar way as described above with reference to FIGS. 1*c* and 1*d*.

A further example of the inventive method will now be discussed with reference to FIGS. 3*a*-3*h*, in which a FinFET structure comprising more than one channel fin 116 is formed from the first fin structure 110 comprising the stack of channel nanosheets 126. The first fin structure 110, the second fin structure 120, and the intermediate middle layer 115, as well as the processing thereof, may be similar to what is described above, except for a few differences of which some are discussed below.

Figure 3A:
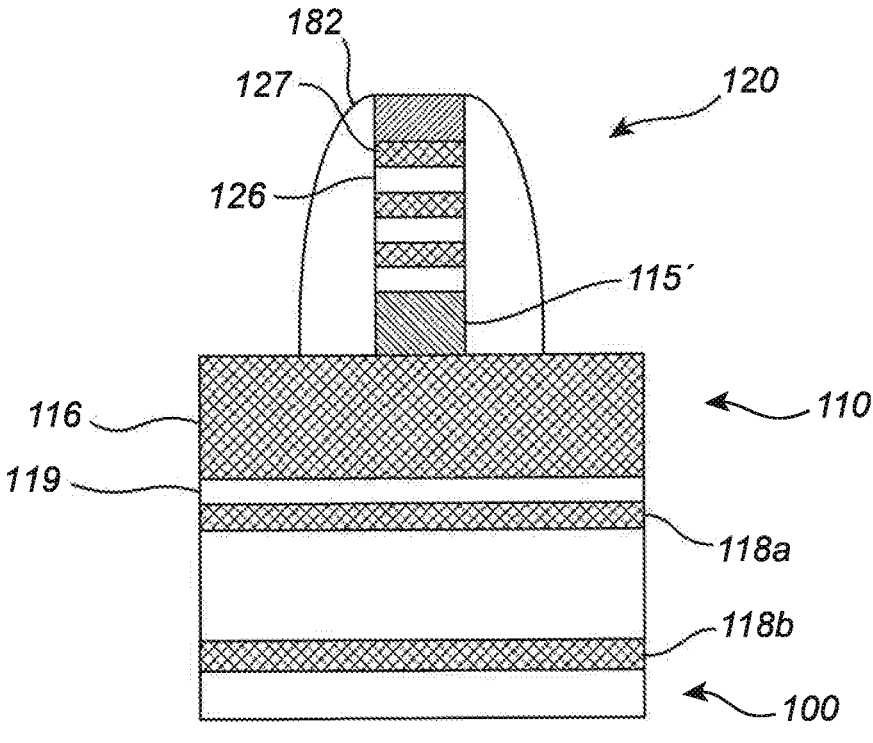
FIGS. 3a-3h illustrate intermediate structures at various stages of a method for forming two channel fin structures above a number of channel nanosheets according to some embodiments.

FIG. 3*a* shows a stacked layer structure similar to the one from which the fin structures 110, 120 in FIG. 1*a* can be formed. In FIG. 3*a*, the fin patterning process has been stopped above the layers of the first fin structure 110, such that only the second, upper fin structure 120 is defined. Thus, the first fin structure 110 and the middle (sacrificial) layer 115' can be etched in the patterning process, while the underlying channel fin layer 116 as well as the etch stop layers 118 are left substantially intact.

Further, a spacer material layer can be conformally deposited on the second channel structure 120 and then etched such that discrete spacer layers 182 remain on opposite side surfaces of the sacrificial middle layer 115' and the stack of channel nanosheets 126 and sacrificial nanosheets 127. The spacer material layer may be, for example, a deposited nitride or carbide (e.g., an ALD-deposited nitride or carbide), such as SiN, SiCO, SiOCN, or SiC. The spacer material layer may be etched back (e.g., top-down, vertically towards the substrate 100) using an anisotropic etch process, such as reactive ion etching.

Figure 3B:
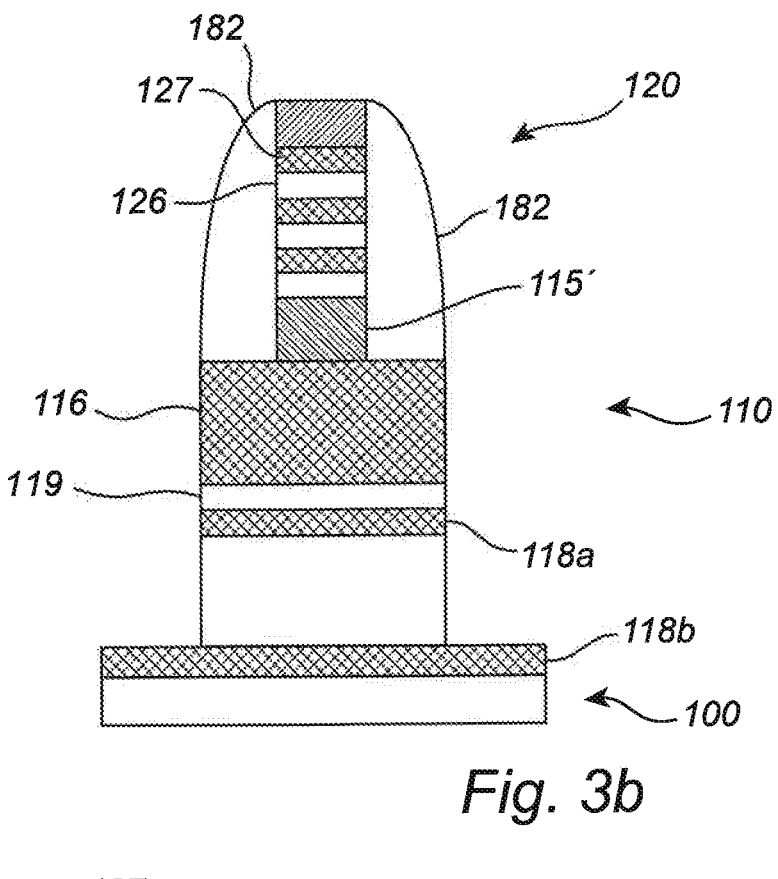

In FIG. 3*b*, the layers of the first fin structure 110 including the channel fin 116 and the optional upper etch stop layer 118*a* have been patterned by etching back the exposed upper surface of the channel fin layer 116 while using the spacer layers 180 as etch masks. The etch may be stopped on the lower etch stop layer 118*b*. Two vertically aligned fin structures 110, 120 have been formed on the substrate 100, wherein first fin structure 110 can be wider than the second, upper fin structure 120.

Figure 3C:
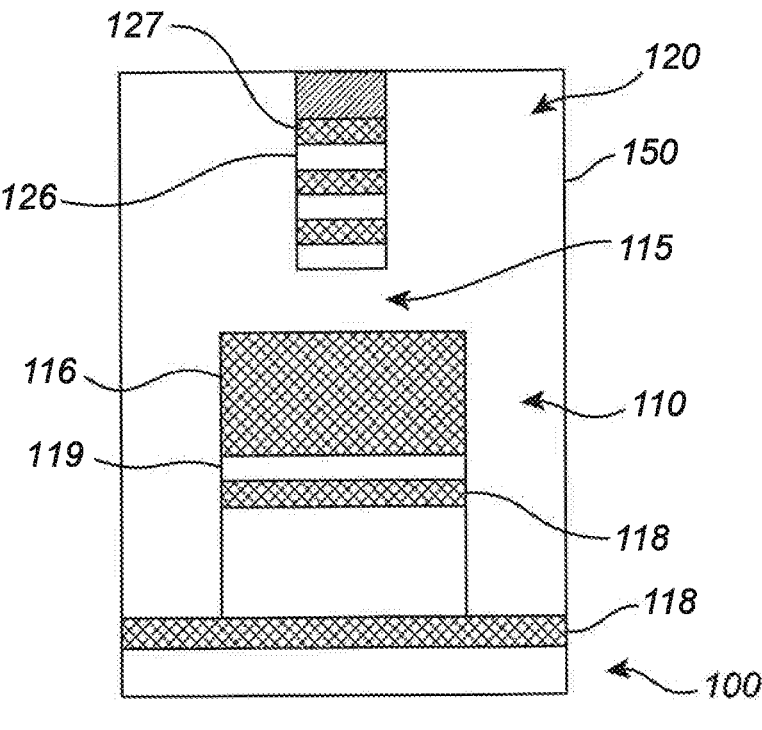
Figure 3D:
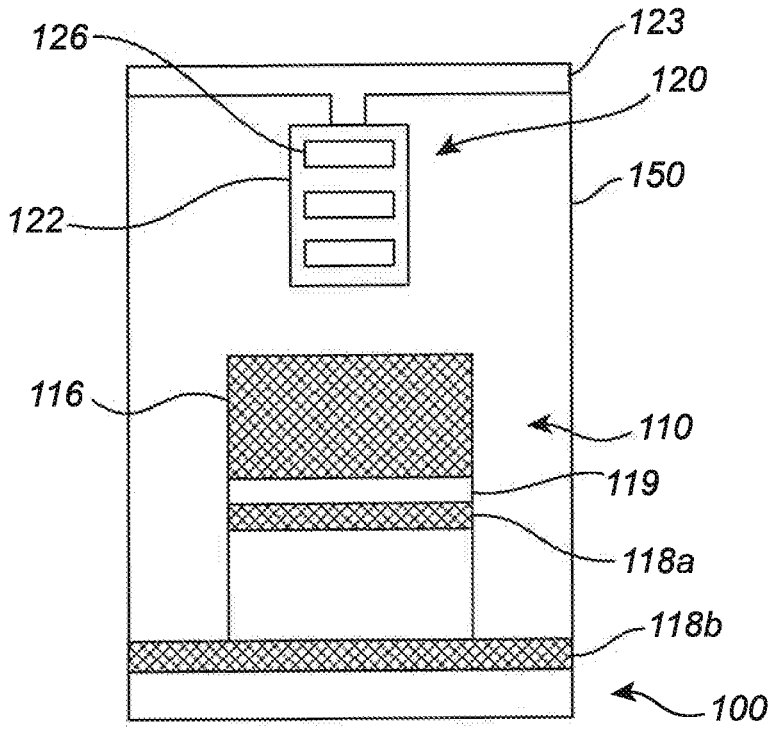

In FIG. 3c, the sacrificial middle layer 115' has been replaced with a dielectric insulating layer 115 and the first and second fin structures 110, 120 embedded in a process layer 150 similar to what is described above in connection with FIG. 1b. Thereafter, as appreciated when studying FIG. 3d, the channel nanosheets 126 may be released in a fin release process and may be provided with a sacrificial gate 122' similar to what is described above with reference to FIG. 1c. This gate definition process may be followed by a source/drain forming process with a result similar to the one shown in FIG. 1d.

Figure 3E:
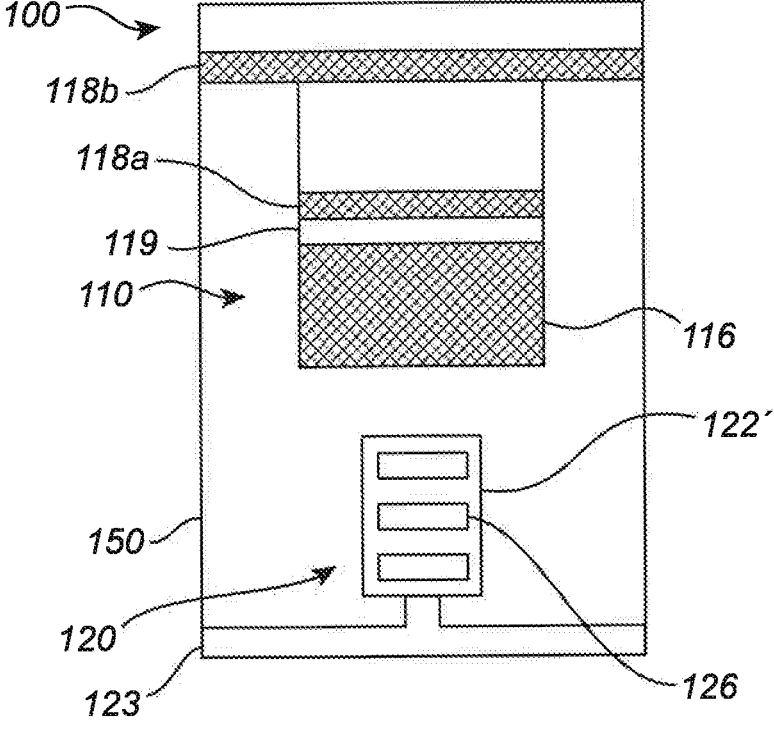

In FIG. 3e, the substrate 100 has been flipped upside down to facilitate processing of the first fin structure 110 from below. Similar to what is described above, the flipping may involve bonding a carrier wafer (not shown) above the second fin structure 120.

Figure 3F:
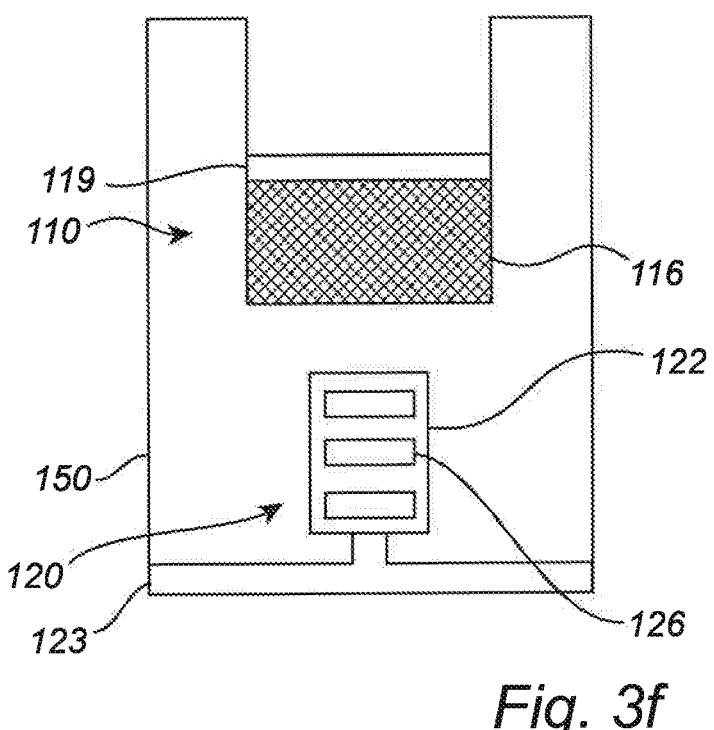

The substrate 100, as well as the lower etch stop layer 118b may be removed to allow the channel fin 116 to be exposed from below. The substrate 100 and the lower etch stop layer 118b may, for example, be planarized and recessed (e.g., by CMP). An etch that is selective to the process layer 150 may be employed to expose the channel fin 116. The result of such a selective etch process is illustrated in FIG. 3f, in which the recess of the fin structure 110 has stopped on the isolating layer 116.

Figure 3G:
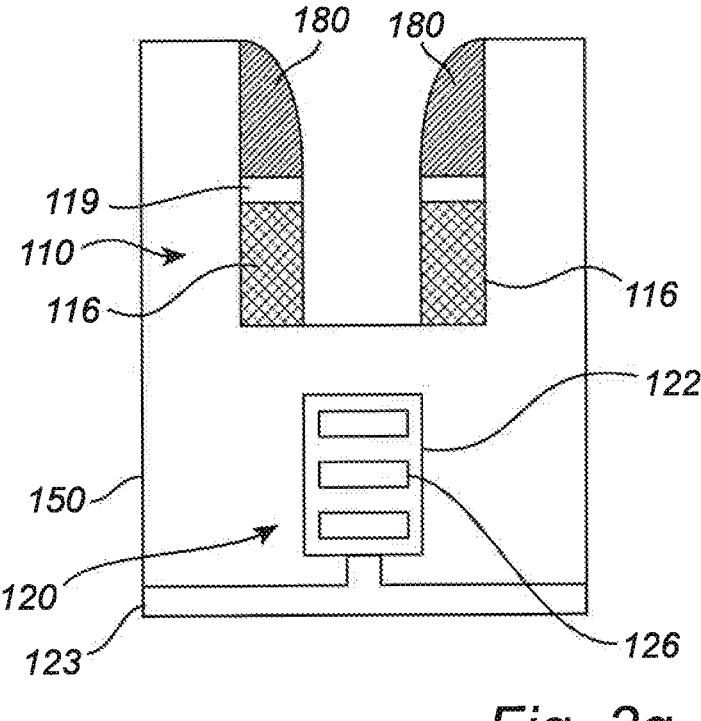

In FIG. 3g, the channel fin 116 has been split by etching back the exposed upper surface of the first fin structure layer stack via the gap formed in the process layer 150 while using spacer layers 180, formed on opposite side surfaces of the gap in the process layer 150. The spacer layer 180 may be similarly configured as the spacer layer 182 discussed above in connection with FIGS. 3a and 3b. Two sub-fin structures can be formed on the middle insulating layer 115, forming a respective channel fin 116. The first fin structure 110 stack may be etched back using an anisotropic etching process. The middle insulating layer 115 can be used as an etch stop layer. As may be appreciated, a resulting width of the channel fins 116 may be controlled through the thickness of the spacer layers 180, wherein a greater thickness can result in a reduced width of the gap in the process layer and a corresponding increased width of the channel fins 180.

Figure 3H:
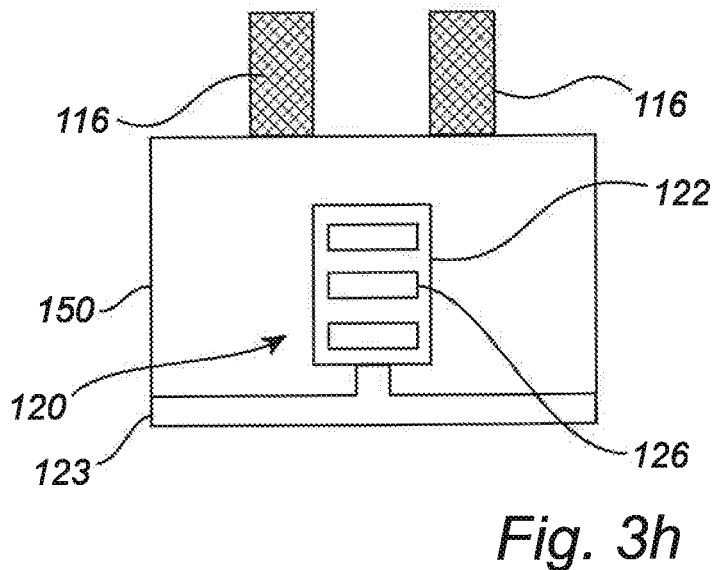

In FIG. 3h, subsequent to splitting the channel fin 116, the spacer layers 180 as well as the isolating material 119 have been removed, for example by employing an etching process selective thereto. FIG. 3h depicts a resulting processed semiconductor device comprising the second fin structure 120, the middle insulating layer 115, and the first fin structure 120 comprising the two upper channel fins 116. The device may be further processed to form a gate structure and source and drain regions for the second fin structure 120 to form a FinFET comprising two fin structures, or two-FinFET, that is disposed above or vertically aligned with a NSHFET.

In the above, the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method for forming a stacked transistor device comprising a nanosheet field-effect transistor (NSHFET) structure and a fin field-effective transistor (FinFET) structure on a frontside of a substrate comprising a frontside and a backside, comprising:
   patterning a vertical stack on the substrate to form a fin structure comprising a first fin structure on the substrate, a second fin structure over the first fin structure, and a middle layer arranged between the first and second fin structures, wherein patterning the vertical stack is performed using a common etch mask such that the first fin structure is self-aligned by the second fin structure;

forming a first gate structure across a channel region of the first fin structure;

forming a second gate structure across a channel region of the second fin structure; and forming source and drain regions for the first and second fin structures, wherein one of the first and second fin structures comprises a stack of channel nanosheets, the stack of channel nanosheets forming at least part of the NSHFET structure; and wherein the other of the first and second fin structures comprises a channel fin, the channel fin forming at least part of the FinFET structure.

2. The method of claim 1, wherein the one of the first and second fin structures further comprises a plurality of sacrificial nanosheets alternatingly arranged with the stack of channel nanosheets, and wherein the method further comprises:

selectively removing the plurality of sacrificial nanosheets from the channel region of the one of the first and second fin structures.

3. The method of claim 2, wherein the method further comprises, prior to selectively removing the plurality of sacrificial nanosheets:

forming at least one anchoring structure extending across the stack of channel nanosheets, wherein the channel nanosheets are anchored by the anchoring structure while the sacrificial nanosheets are being removed.

4. The method of claim 2, further comprising, subsequent to selectively removing the sacrificial nanosheets:

forming a sacrificial gate structure across the stack of channel nanosheets; and replacing the sacrificial gate structure with the one of the first and second gate structures.

5. The method of claim 4, wherein replacing the sacrificial gate structure with the one of the first and second gate structures comprises replacing the sacrificial gate structure with the one of the first and second gate structures after forming the source and drain regions for the one of the first and second fin structures.

6. The method of claim 2, wherein the channel nanosheets are formed of $SiGe_y$ and the channel fin is formed of $SiGe_z$, wherein each one of y and z is greater than or equal to 0 and wherein y differs from z.

7. The method of claim 6, wherein the sacrificial nanosheets are formed of $SiGe_x$, wherein x is greater than or equal to 0 and y differs from x and z.

8. The method of claim 7, wherein x is from about 0.15 to about 0.45, wherein y is about zero, and wherein z is from about 0.15 to about 0.65.

9. The method of claim 1, wherein the middle layer is a sacrificial middle layer, and wherein the method further comprises replacing the sacrificial middle layer by a dielectric insulating layer separating the first and second fin structures.

10. The method of claim 9, further comprising:

subsequent to replacing the sacrificial middle layer, reducing a width of the channel fin.

11. The method of claim 1, further comprising:

forming a bonding layer above the second fin structure;

bonding a carrier wafer to the bonding layer; and flipping the substrate upside down to allow processing from the backside of the substrate.

12. The method of claim 1, wherein the first fin structure comprises the channel fin and the second fin structure comprises the stack of channel nanosheets, wherein the method further comprises:

forming a process layer, wherein the first fin structure and the second fin structure are embedded in the process layer;

etching the first fin structure from below to form a recess in the process layer;

forming spacers on opposite side surfaces of the recess to form a reduced-width gap between the spacers;

splitting the first fin structure by etching back the first fin structure in the reduced-width gap, using the spacers as an etch mask protecting underlying portions of the first fin structure; and recessing the process layer and the spacers to reveal the underlying portions of the first fin structure, the underlying portions forming a first and a second channel fin.

13. The method of claim 12, wherein the first fin structure further comprises an etch-stop layer, and wherein etching the first fin structure to form the recess comprises etching back the first fin structure until the etch-stop layer is exposed.

14. The method of claim 1, wherein forming the source and drain regions for the first and second fin structures comprises:

forming epitaxial source and drain bodies of a first conductivity type on opposite end surfaces of the stack of channel nanosheets; and forming epitaxial source and drain bodies of a second conductivity type on opposite end surfaces of the channel fin.

15. The method of claim 14, wherein the first conductivity type is different from the second conductivity type.

* * * * *